United States Patent [19]

Trotel

[11] 4,051,381
[45] Sept. 27, 1977

[54] DEVICE FOR THE PROGRAMMED TRACING OF DESIGNS BY PARTICLE BOMBARDMENT

[75] Inventor: Jacques Trotel, Paris, France
[73] Assignee: Thomson-CSF, Paris, France
[21] Appl. No.: 639,105
[22] Filed: Dec. 9, 1975

[30] Foreign Application Priority Data
Dec. 13, 1974    France ................................ 74.41130

[51] Int. Cl.$^2$ ............................................ H01J 29/00
[52] U.S. Cl. .................................. 250/492 A; 250/398
[58] Field of Search ........... 250/492 A, 492 R, 492 B, 250/396, 398

[56] References Cited

U.S. PATENT DOCUMENTS

| | | | |
|---|---|---|---|
| 3,778,626 | 12/1973 | Robertson ..................... | 250/492 A |
| 3,866,013 | 2/1975 | Ryan ............................. | 250/492 A |
| 3,876,883 | 4/1975 | Broers et al. .................. | 250/492 A |
| 3,894,271 | 7/1975 | Pfeiffer et al. ................. | 250/492 A |
| 3,900,737 | 8/1975 | Collier et al. ................... | 250/492 A |
| 3,914,608 | 10/1975 | Malmberg ...................... | 250/492 A |

*Primary Examiner*—Alfred E. Smith
*Assistant Examiner*—B. C. Anderson
*Attorney, Agent, or Firm*—Cushman, Darby & Cushman

[57] ABSTRACT

The present invention relates to a device designed to automatically trace designs at a very small scale. The device comprises an electron-optical system forming an elementary image of extremely small dimensions, of a diaphragm. A scanning system makes it possible to display said image, line by line over the surface which is to be printed, in a first direction, while a mechanical system displaces the surface in a direction perpendicular to the first direction. The arrangement is controlled by a logic system supplying code numbers which indicate the programme to be followed in respect of each line. The invention applies to microelectronics.

6 Claims, 13 Drawing Figures

| O B | CODE |
|---|---|
| 0 0 | |
| 0 1 | — — ↙ — — |
| 1 0 | — — ↓ — — |
| 1 1 | — — ↓ — — |

Fig. 9

| MOB | |
|---|---|
| 000 | P. C. |
| 001 | — — — — — ∧ — — — — |
| 010 | — — — — — ↑ — — — — |
| 011 | — — — — — ↑ — — — — |
| 100 | ∨ ↓ ↙ ∠ ⊥ ↘ ⌐ |
| 101 | — — — — ↗ ↗ → → |
| 110 | — — — ↖ ← ⊣ ← |
| 111 | — — — — ⊤ ⊤ ↑ ↑ |

| MOB \ OB | 00 | 01 | 10 | 11 |
|---|---|---|---|---|
| 000 | 000 | 100 | 001 | 010 |
| 001 | 101 | 111 | 111 | 111 |
| 010 | 110 | 111 | 111 | 111 |
| 011 | 011 | 111 | 111 | 111 |
| 100 | 000 | 000 | 000 | 000 |
| 101 | 100 | 111 | 100 | 100 |
| 110 | 001 | 001 | 111 | 001 |
| 111 | 010 | 010 | 010 | 111 |

| A | B | | | C | | | F.M |
|---|---|---|---|---|---|---|---|
| | $x_{p-1} x_p$ | $x_p x_{p+1}$ | | T-2 | T-1 T+1 | T+2 | |
| | | 00 | | | | | 000 |
| | | 00 | 10 | | | | 001 |
| | | 11 | 10 | | | | 010 |
| | | 11 | | | | | 011 |
| | 01 | 00 | | | | | 100 |
| | 01 | 00 | 10 | | | | 101 |
| | 01 | 11 | | | | | 110 |
| | | | | | | | 111 |

DEVICE FOR THE PROGRAMMED TRACING OF DESIGNS BY PARTICLE BOMBARDMENT

It is well known to manufacture upon semiconductor substrates patterns intended for example to become masks for the manufacture of integrated circuits. The devices used for this purpose are originated from electron-microscopes. The horizontal and vertical deflection systems are controlled by data processing systems, enabling these designs to be programmed. In the devices used up to now, the two deflection systems of an electron beam generator receive control voltages from the computer. This has resulted in a certain degree of slowness in the production of the patterns and in a small size on the part of each of the designs produced.

The object of the present invention is a device which makes it possible both to increase the size of the designs and the speed with which they are traced.

The automatic tracing device in accordance with the invention is of the kind in which an electron beam scans successive rectangular areas of a surface covered by a resin sensitive to the impact of these particles, the scanning of each area or page being effected line by line, by deflection of the electron beam, the scanning of the successive lines being produced by a mechanical displacement. The device in accordance with the invention is essentially characterised in that it comprises a logic circuit furnishing coded signals translating the slopes of polygonal contours, these slopes having fixed values and their number being defined by the number of digits furnished by the logic circuit.

The invention will be better understood from a consideration of the ensuing description and by reference to the attached drawings in which:

FIG. 1. is a highly schematic view of the apparatus in accordance with the invention;

FIGS. 9, 10, 11, 12 and 13 are tables representing the codes used.

Figure 1:
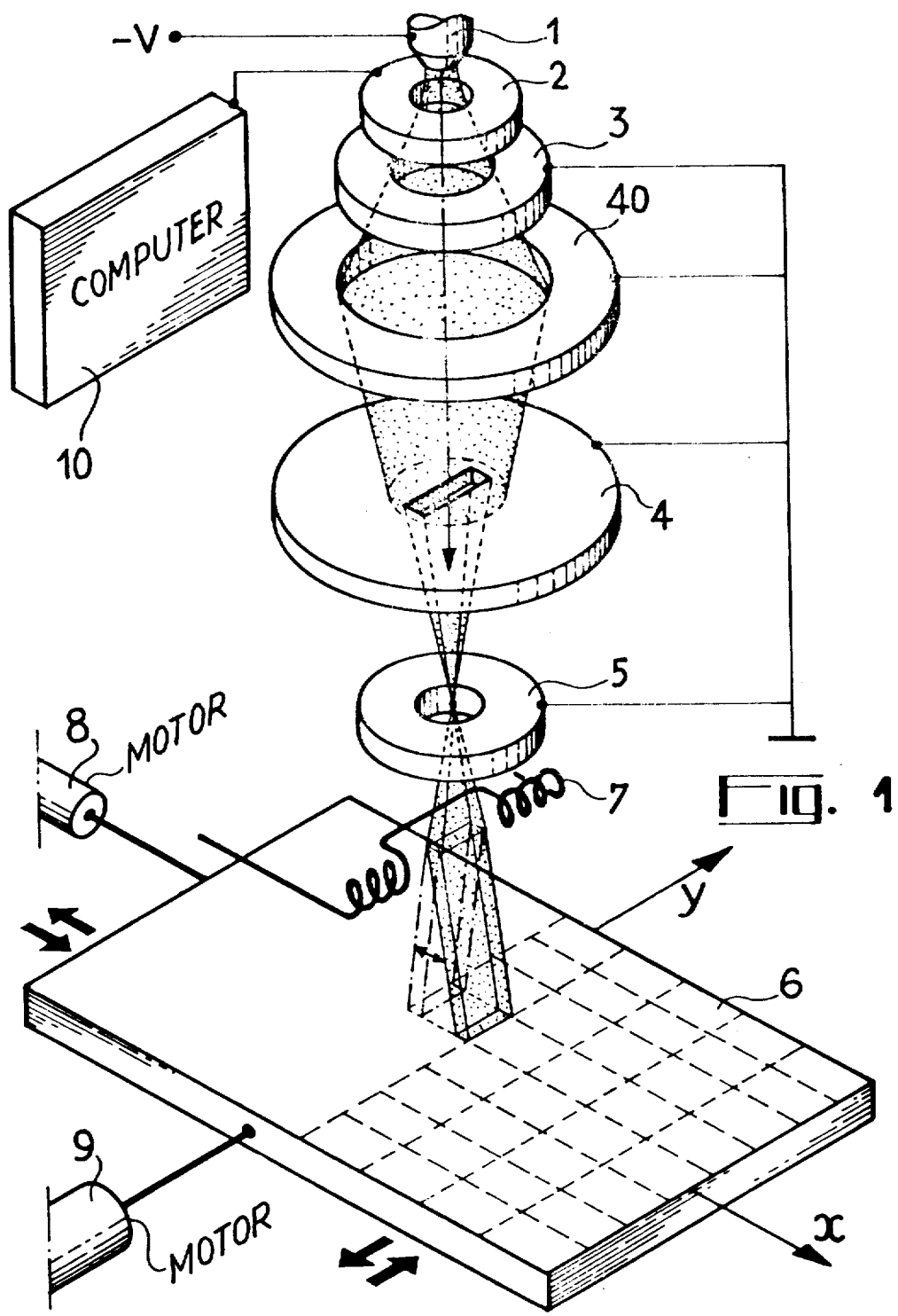

The electron-optical device in accordance with the invention, shown in FIG. 1, comprises a cathode 1, a modulating electrode 2, an anode 3 placed at a positive potential in relation to the cathode, a rectangular diaphragm 4, and a condenser 40. An electron-optical system 5 forms a reduced image of the diaphragm 4, the reduction for example being in the ratio of 1:100, on the sample 6. The condenser 40 is designed to cause all the electrons which are passed through the diaphragm 4; to converge in the entrance pupil of the electron-optical system 5.

The diaphragm 4 is orientated in such a fashion that its image on the specimen 6 has its two sides parallel to two axes $Ox$ and $Oy$ forming with the optical axis of the system, a rectangular three-coordinate system. These two axes $Ox$ and $Oy$ are parallel to preferred directions of displacement of the specimen 6.

An electromagnetic or electrostatic deflection system 7 makes it possible to displace said image in the direction close to $Ox$, without altering its shape. The deflection system will for example be located downstream, as it were, of the electronic lense 5. Two motors 8 and 9 enable the sample holder to be displaced in the direction $Ox$ and $Oy$ respectively. The motor 9 produces continuous displacement of the sample holder 7. The scanning motion of the electron beam, in the direction $Oy$ is produced mechanically. By contact, as FIGS. 1 and 2 show, in the direction $Ox$ the scanning motion is produced by the horizontal X-deflection system.

Figure 2:
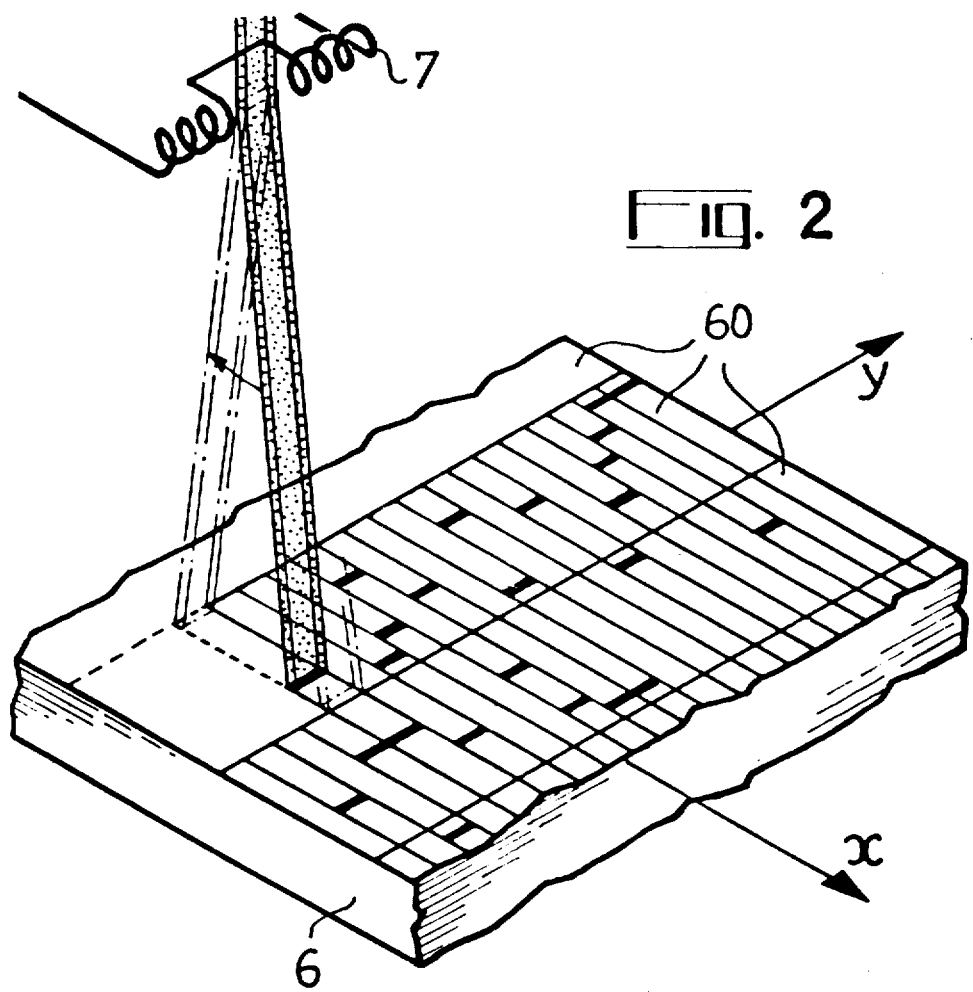
FIG. 2 is a simplified diagram of the device shown in FIG. 1.

FIG. 2 illustrates each portion 60 of the specimen 6 upon which the pattern is to be traced and which carries a resin sensitive to electron bombardment. The image to be traced is divided, in the direction $Ox$, into pages delimited by straight lines parallel to $Oy$, all these pages having the same width. Each page is scanned line by line in the X-direction, in the same way as a television image, the scanning in the Y-direction being produced by the displacement of the sample holder. A computer 10, whose interface will be described in more detail hereinafter, ensures that the beam is cut off in accordance with a predetermined programme.

Figure 3:
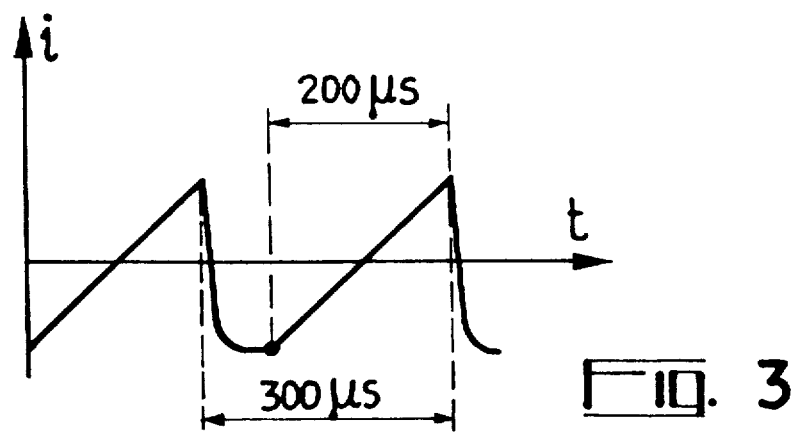
FIG. 3 is an explanatory diagram.

FIG. 3 plots the current in the coils 7 as a function of T. In a non-limitative example, the current has a period of $300\mu s$ and a slope allowing the tracing function in $200\mu s$. The image is traced line by line by displacement of the rectangle formed by the image of the diaphragm, the latter having a dimension of $u/4 = 0.6$ microns in the $Ox$ direction and $u = 2.5$ microns in the $Oy$ direction. Thus, each scanned line has a transverse dimension of 2.5 microns and a longitudinal dimension of 1.25 mm. In the following, the logic system and the method for carrying out programmed tracing of an image will be described.

It will be assumed in the following that the images are closed polygonal contours and moreover that the sides of each polygon are parallel to the $Oy$ axis, or inclined at 45° to this axis that is to say directed in accordance with one or the other of the bisectors of the angle $yOx$, as required.

Figure 4:
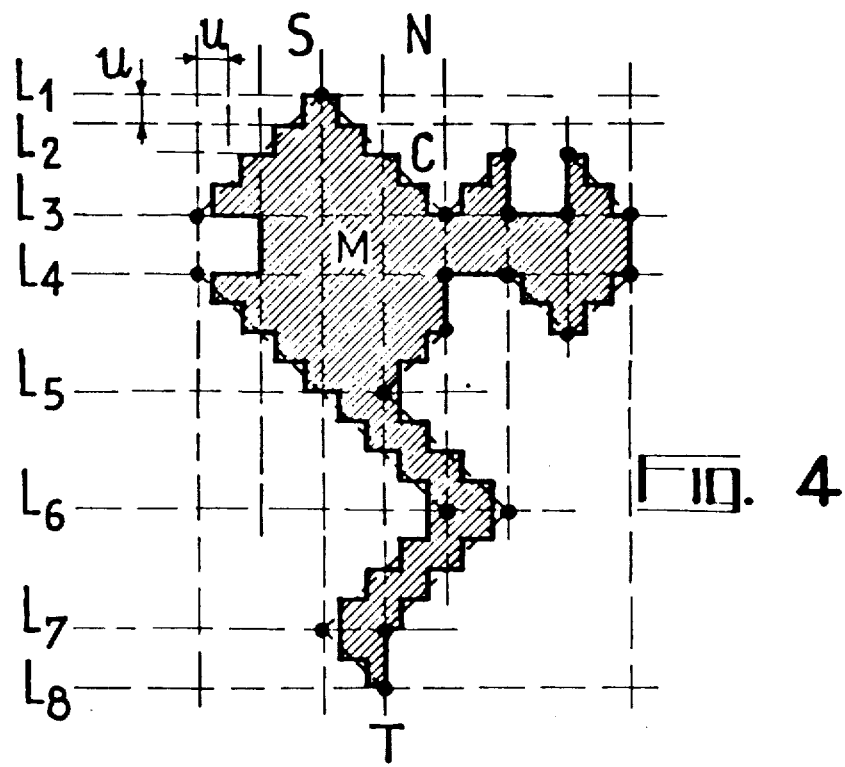
FIG. 4 is a possible example of patterns which the device is capable of tracing.

FIG. 4 illustrates an example of a contour traced by the device in accordance with the invention. The broken lines illustrates the theoretical line of the contour while the full lines illustrate the pattern produced by the device in accordance with the invention; the pattern is formed line by line, working from top to bottom in FIG. 4.

Figure 5:
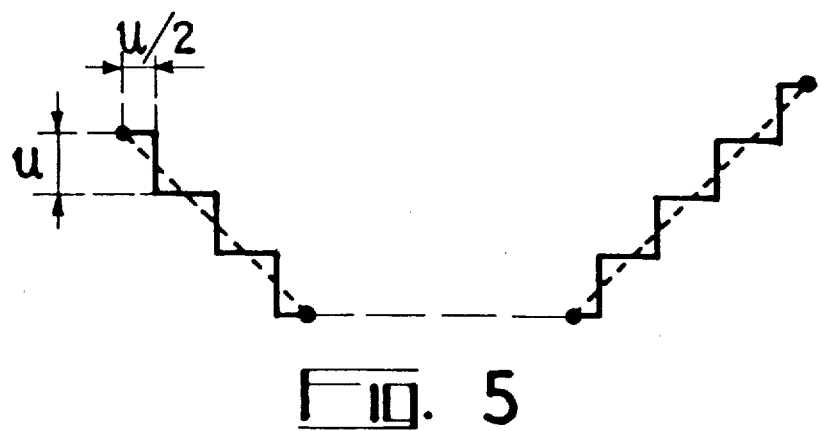
FIG. 5 illustrates two details of the design shown in FIG. 4.
Figure 6:
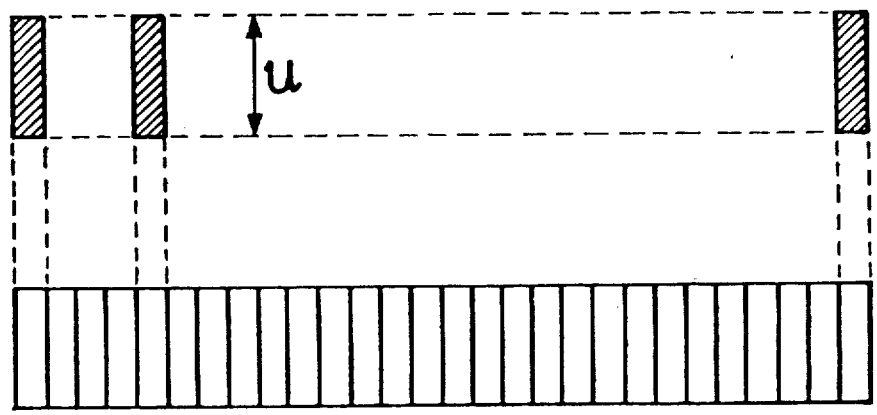
FIG. 6 is an explanatory diagram.

Each 45° slope is produced in the manner shown in FIG. 5. Each inclined line is traced by successive steps of sidelength $u$. Each line of the image is a succession of rectangles as FIG. 6 shows, having dimensions of $u/4 \times u$, produced by a series of beam unblocking or blocking steps.

This being so, a description will now be given of the interface logic circuit which links the computer to the electron-optical system beginning the following definitions must be made:

Before any description, referring to FIG. 4, it will be seen that there are two types of scanned lines.

A. Lines which change, namely lines at which the corners of the polygonal contour are encountered, that is to say, the lines marked $L_1$, $L_3$, $L_4$, $L_5$, $L_6$, $L_7$, $L_8$. These lines are, in a manner of speaking, unforeseen lines since the pattern does not bear any relationship to the trace of the preceding line. In other words, there is no means of knowing a priori, the pattern of the sides of polygons beginning from the line $L_1$, and in particular it is not possible to make such prediction on the basis of the pattern followed by the preceding line.

B. Normal lines. These are the other lines, that is to say those which do not meet a corner of the polygon. Each of these lines has a pattern which is derived from that of the preceding line. In other words, the information contained in each of these lines makes it possible to trace the next line. Taking the line $L_2$, for example, which follows the change line $L_1$, it is possible to know the slopes of the sides of the polygon commencing at $L_1$ so that it is a simple matter to determine the start and end of the illuminated portion of the line $L_2$.

Figure 7:
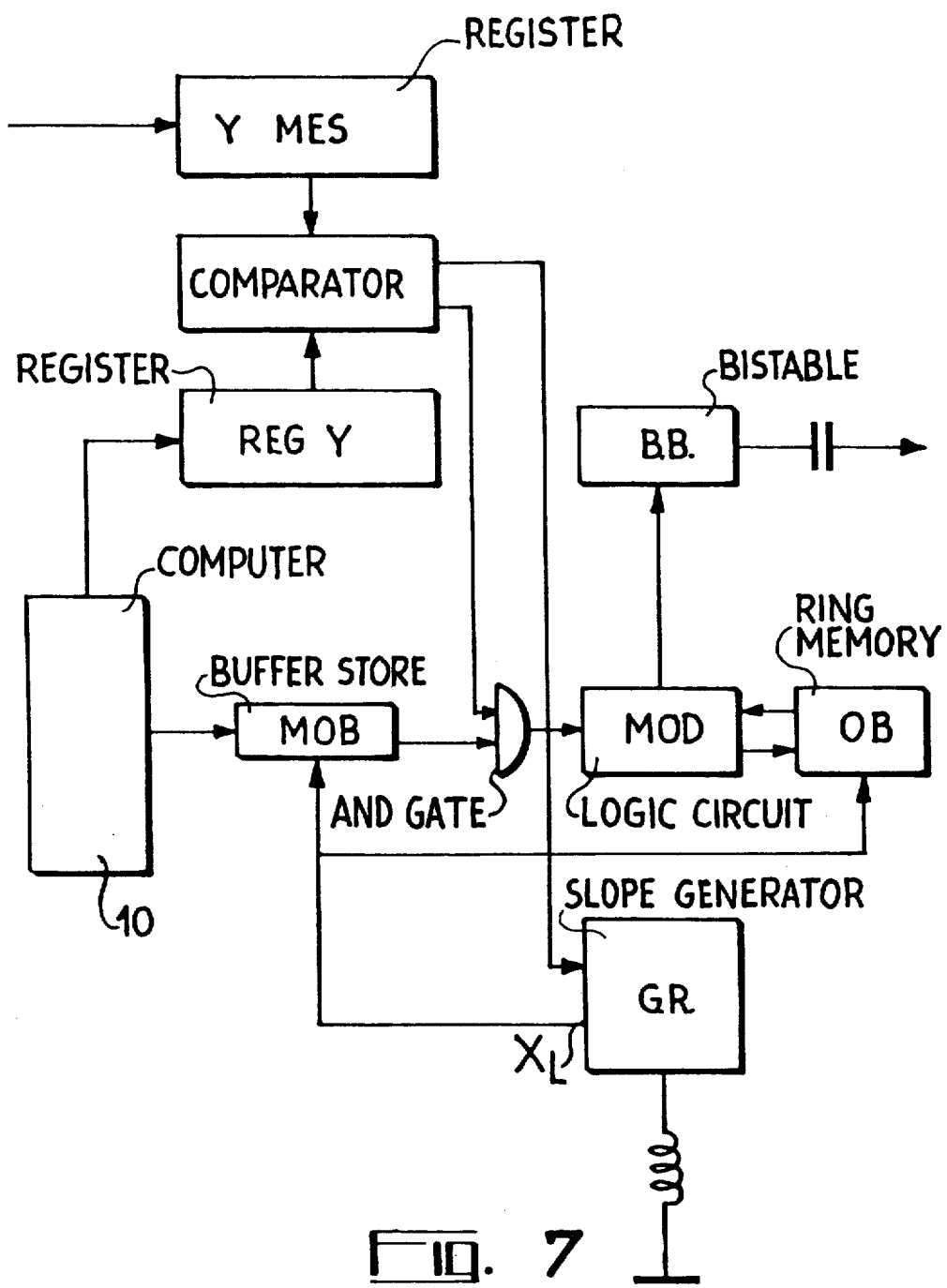
FIG. 7 is a diagram of the logic system associated with the the device of FIG. 1.

It is from these observations that the scheme for the interface logic of the device in accordance with the invention, and as shown in FIG. 7, has been derived. The computer 10 of FIG. 1 has a third output which supplies to a register REG Y, the value Y of the ordinate position of the next change line.

The true value Y of the position of the specimen, measured by means which have not been shown and translated into digital data, is recorded in a register YMES. A comparator COMP is supplied with the outputs from these two registers and acquires the 1 condition when said outputs coincide. This output is connected to a first input of an AND-gate.

A second output, when a change line is traced, furnishes through the medium of a buffer memory MOB a series of words which, in the example described, is made up of 501 words of 3 "bits" or digits, in binary notation. The output of this store is connected to the second input of the AND-gate which, when the comparator COMP is in the 1 condition, supplies the output digits from the store MOB to a logic circuit MOD known as a modifier circuit. One of the outputs of this circuit MOD operates the bistable trigger stage B.B which applies its output voltage to the modulating electrode of the electronic system or to some other system for modulating the intensity of the beam. The bistable trigger stage changes from one state to the other under the control of a pulse and, in one of these states, it blocks the modulating electrode.

The circuit MOD has another output connected to a ring memory store OB containing 500 words of two digits each. This ring memory is addressed by a sawtooth signal generator or slope signal generator G.R. This slope generator is triggered by the comparator COMP. The stores and the circuit MOD are interconnected in the following way:

at each point in the line, the circuit MOD performs logic operations which are a function of the control signals which it receives simultaneously from the memories MOB and OB.

In accordance with these signals, it either does or does not supply pulses to the bistable trigger stage BB, for one thing. For another, it acts upon the memory OB which it prepares for the recording of the next line. The assembly of these processes will be described in the following.

Figure 8:
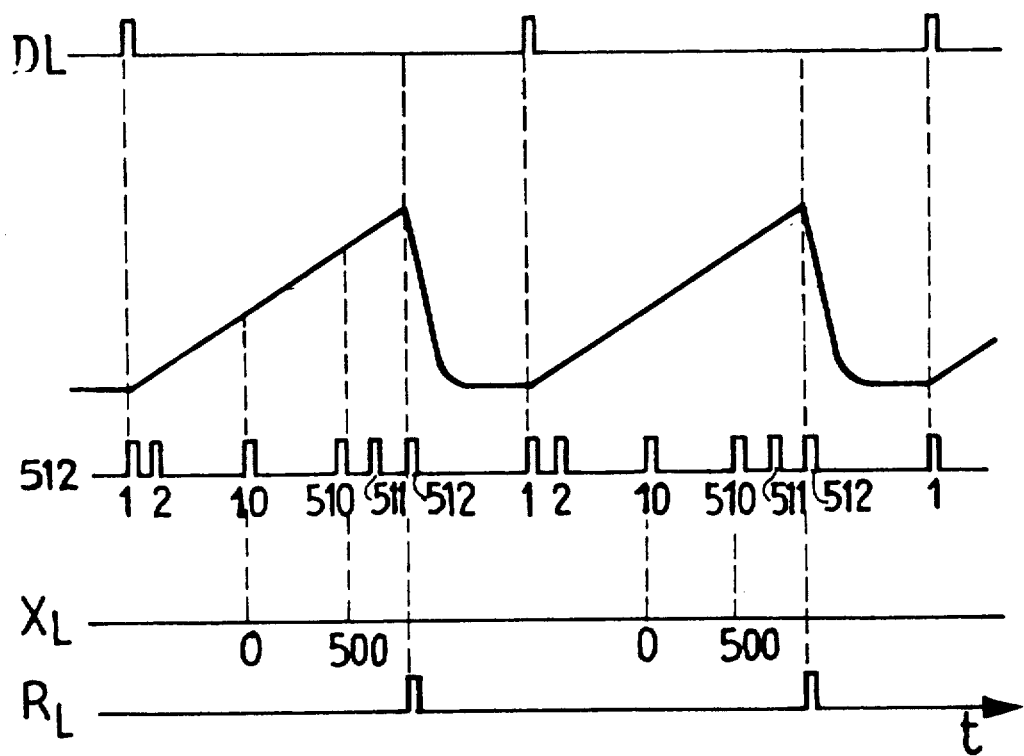
FIG. 8 illustrates the time-based voltage function applied to the scanning device.

A. Slope generator G.R. This is supplied with a line start pulse DL, FIG. 8 from the comparator, which triggers its operation. Each slope is accompanied by 512 equally spaced pulses, of which the ten first correspond to a dead time prior to the start of the slope whilst the pulses marked 0 to 501 each correspond to a point in the line. These latter pulses are supplied to the stores MOB and OB and control the rhythm of operation of the latter. The voltage slope proper is applied to the scanning system and controls its operation (FIG. 8).

B. Operation of the system MOB-MOD-OB.

a. The store OB prepared for a given line, contains in respect of each abscissa point $X_L$, a word or a number of "bits" in the binary notation. The table has been shown in FIG. 9.

The digit 00 corresponds, in respect of a given point, to the absence of a contour element. In other words, if it were to operate on its own, the store OB would have no effect upon the bistable trigger stage BB and the beam would remain in the same state either unblocked or blocked. The two other numbers 01 and 10 correspond to contours having sides disposed at 45° towards the right or towards the left, as indicated. The number 11 corresponds to a vertical side.

This store has no direct communication with the computer. As we have seen earlier, it receives its words from a circuit MOD and acts upon the latter in combination with the store MOB.

FIG. 10 illustrates the code table for the store MOB, the number 000 indicating the absence of a corner of the polygonal contour, in the case of the addressed point.

The numbers 001 to 111 indicate the addressed point is one of the corners of the contour. Each number in the code indicates the nature of the slopes which terminate at this corner.

It should be pointed out that a given number corresponds to several types of corners. It is only by a confrontation with the number recorded at the same instant by the store OB, that the type of corner is fixed in accordance with the table of FIG. 11.

All the configurations marked E are due to errors. In other words, a configuration 010 in MOB is incompatible, for example, with the configuration 01 of the ring memory OB. To understand the operation of the system, referring for example to FIG. 4, it can be seen that a pattern contains several kinds of points.

a. The points M an N which are respectively inside and outside the contour. In this case, when scanning one of these points, the bistable trigger stage does not change state. The ring memory OB indicates 00.

b. The points C in the contour other than corners of the polygon. When scanning involves one of these points, the beam should either be unblocked or blocked, as the case may be. At the preceding point, the beam should be unblocked (or blocked) and at the following point it should be blocked (or unblocked). In other words, passage over this contour must be accompanied by a pulse. The store OB acquires one of the states 01, 10 or 11. At the same address in the following line, it will acquire the state 00 if the slope of the contour is one of the oblique portions.

c. Corner of a polygon. The store MOB must come into operation and bring about unblocking of the beam slightly before this corner is passed, whilst bringing about blocking of the beam after it has been passed (this is the case with the corner marked S) or during transit of the point (this is the case with the corner marked T). It must then act through the medium of the logic circuit MOB on the store OB so that at the time of recording of the next line, at the same address, it takes account of the nature of the slope.

The role of the system MOD will therefore be clear. As a function of the information coming from MOB and OB, it must act in an appropriate way upon the bistable trigger stage on the one hand, and on the other hand must prepare the store OB, taking account of this information in order to trace the next line.

FIG. 13 illustrates all the cases of figures, as well as the corresponding sequences of beam blanking. In column A, it shows the cases of figures, in the second column B it shows what the ring memory OB must record in order to pattern the next line $y_{q+1}$, at the points $x_{p-1}, x_p, x_{p+1}$ where $x_p$ is the address in question, in the third column C the sequences of pulses supplied to the erase system, at the time of patterning the line $y_q$, and in column D the values of the modification function, in order to pattern the line $y_{q+1}$.

It should be pointed out that $\tau$ is the time corresponding to the scanning of half a unit of measurement, namely $u/2$, i.e. corresponding to the scanning of two successive points, whilst T is an instant following the appearance of an address pulse by a quantity slightly greater than $\tau$.

In order to understand this table, it must be referred to FIGS. 4 and 5. In FIG. 5 it is clearly shown how a 45° slope is translated into terms of steps of length $u$ and raise $u$ (unit of measurement).

Figure 11:
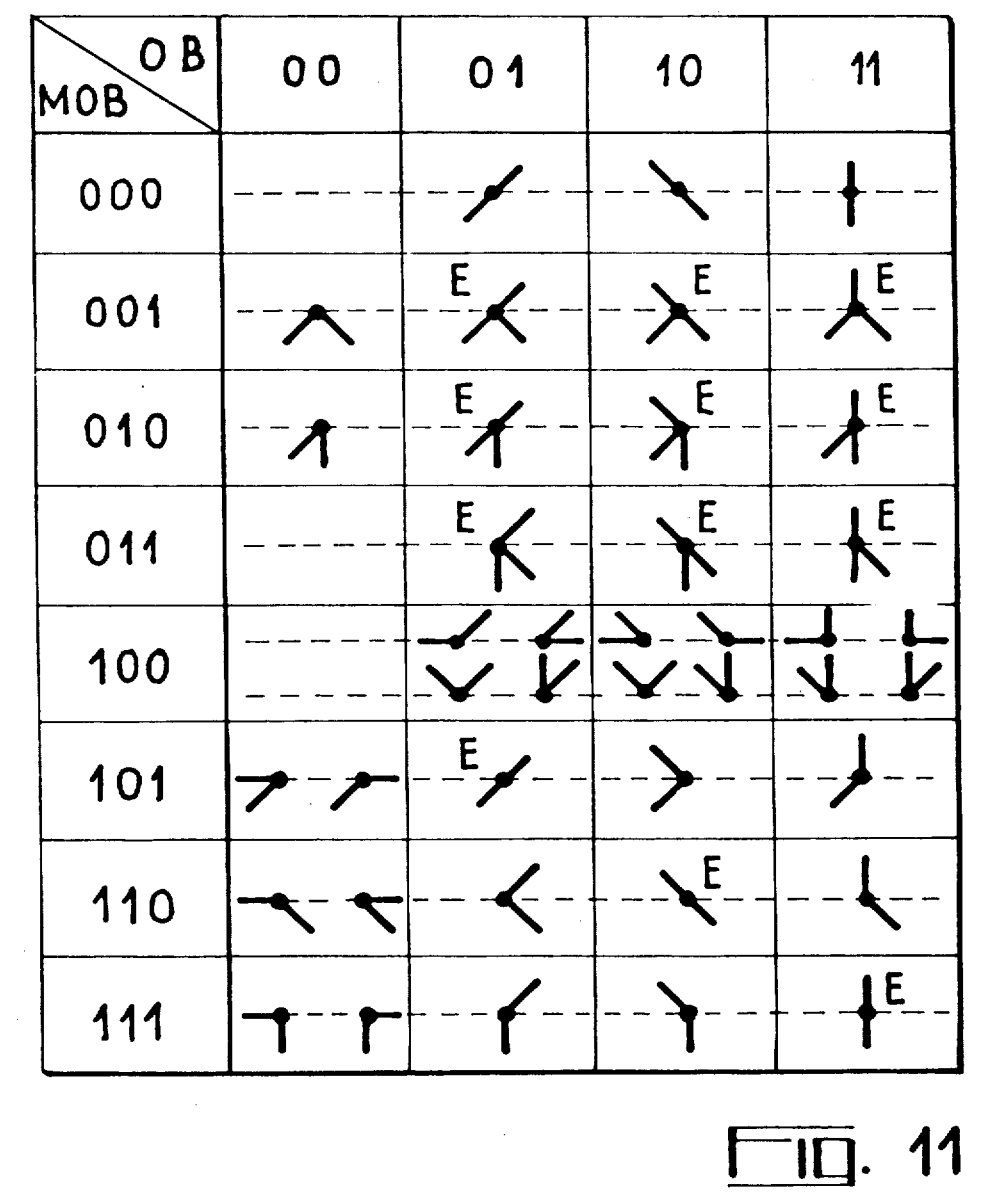

Taking all the cases of figures in the first line of the table of FIG. 11, it will be seen that it is concerned with the corners of polygons, these corners being located in the line $y_q$ and being translated by the absence of traces in line $y_{q+1}$ for the same value of $x$.

This is the case of the corner T shown in FIG. 4. For a corner of this kind, the beam is not blanked or lighted since the scanned line is tangential to the contour.

It will readily be understood that in the case where the sides of a corner are directed downwards, the system BB would produce two pulses as indicated in cases 4, 6 and 7.

In other cases, there will only be one pulse at the monostable trigger stage B. FIG. 12 indicates the logic function OB/MOB, that is to say the shape code of the modification logic device.

The number 111 corresponds to an error.

It should be pointed out that by means of a larger number of digits in each word in the store MOB, it would be possible to cope with slopes other than 45° slopes.

What I claim:

1. An automatic device for forming programmed patterns upon a substrate, comprising an electron optical system, for forming an electron beam, means for deflecting said beam, a control electrode for controlling its intensity by all or nothing fashion, a data processing system for controlling said deflecting means and said control electrode, said device comprising upon the beam trajectory, a diaphragm in order to delimit the beam trajectory, and a lens for projecting onto the substrate a very small scale image of said diaphragm, said deflection means making it possible to displace said image, in order to scan said substrate line by line parallel to a first direction $Ox$, motor displacing means, actuated by said data processing system, for scanning the substrate line by line, by displacement of the substrate in a second direction $Oy$, perpendicularly to the first, by all or nothing control of the beam causing said pattern to be formed line by line by the succession of exposed and unexposed areas.

2. A device as claimed in claim 1, wherein said elementary image is a rectangle, the patterns being polygonal contours having sides of predetermined directions, each side being traced in an approximate fashion by shifting the elementary original images of the contour of one line in relation to the next, by a whole number of sides of said elementary image.

3. A device as claimed in claim 2, wherein the elementary image is a rectangle having sides respectively direction $Ox$ and $Oy$, the said sides parallel to $Ox$ being smaller then the sides parallel to $Oy$, the sides of the polygonal contour having directions parallel to $Ox$ or $Oy$, or the two directions inclined at 45° to $Ox$.

4. A device as claimed in claim 3 in which, between said data processing system and said deflection system is connected an interface logic circuit said interface logic circuit operating in a binary code; said interface circuit comprising a first ring memory and a second memory, said memories having the same number of addresses; the numbers stored in said addresses in said first memory a number having significant digits lower that the number of said second memory, said numbers of said first memory being indicative of the slopes for this contour for the line to be patterned said numbers in said second memory indicating a slope variation, said memories being interconnected, said second memory being directly connected to said data processing system; a sawtooth voltage generator connected to said data-processing system, said saw-tooth voltage generator, further delivering in synchronism sequentially pulses in a number at least equal to that of the addresses for triggering successively the reading out of the numbers stored in said memories; a logical circuit receiving said digits of said memories at the addresses corresponding to each other; said logic circuit on one side rewritting the numbers in said ring memory for the following line, on the other side controlling a bistable device controlling by all and nothing said control electrode of said beams.

5. A device as claimed in claim 4, wherein said first ring memory stores two digit numbers said second memory stores three digit numbers; said two digits numbers coding respectively two slopes inclined at 45° over the axis $Ox$ and a slope parallel to the $Oy$ axis.

6. A device as claimed in claim 1 wherein the beam is an electron beam and the substrate is covered by a resin layer sensitive to electron bombardment.

* * * * *